United States Patent [19]

Inuzuka et al.

[11] Patent Number: 5,532,607
[45] Date of Patent: Jul. 2, 1996

[54] SEMICONDUCTOR DEVICE INSPECTION SYSTEM INVOLVING SUPERIMPOSITION OF IMAGE DATA FOR DETECTING FLAWS IN THE SEMICONDUCTOR DEVICE

[75] Inventors: Eiji Inuzuka; Shigehisa Oguri; Kouji Suzuki; Wataru Nagata; Yasushi Hiruma, all of Hamamatsu, Japan

[73] Assignee: Hamamatsu Photonics K.K., Hamamatsu, Japan

[21] Appl. No.: 274,716

[22] Filed: Jul. 18, 1994

[30] Foreign Application Priority Data

Jul. 19, 1993 [JP] Japan .................................. 5-177957

[51] Int. Cl.⁶ .................................................. G01R 31/26
[52] U.S. Cl. ........................................................ 324/750
[58] Field of Search ............................ 324/158.1, 731, 324/765; 356/160; 382/8; 250/310, 311, 370.01, 461.1, 372; 348/139, 79

[56] References Cited

U.S. PATENT DOCUMENTS

| | | | |
|---|---|---|---|
| 4,033,697 | 7/1977 | Pfoutz et al. ........................ | 356/160 |
| 4,477,926 | 10/1984 | Linger et al. ...................... | 382/8 |
| 4,644,404 | 2/1987 | Tabei . | |
| 4,786,865 | 11/1988 | Arimura et al. ..................... | 324/765 |
| 4,806,776 | 2/1989 | Kley ................................... | 348/139 |
| 4,811,090 | 3/1989 | Khurana ............................. | 358/101 |
| 5,072,122 | 12/1991 | Jiang et al. ........................ | 250/370.08 |
| 5,126,569 | 6/1992 | Carlson . | |
| 5,149,972 | 9/1992 | Fay et al. ........................... | 250/372 |

FOREIGN PATENT DOCUMENTS

| | | |
|---|---|---|
| 149849 | 7/1985 | European Pat. Off. . |
| 179309 | 4/1986 | European Pat. Off. . |
| 242045 | 10/1987 | European Pat. Off. . |
| 418918 | 3/1991 | European Pat. Off. . |
| 61-263235 | 11/1987 | Japan . |
| 62-257739 | 4/1988 | Japan . |
| 63-134943 | 10/1988 | Japan . |
| 1109735 | 8/1989 | Japan . |
| 41560 | 1/1992 | Japan . |
| 5129401 | 5/1993 | Japan . |

OTHER PUBLICATIONS

Mitsuhashi et al, "Failure Analysis of Multilevel Metalized LSI Using Optical Beam Induced Current" Oct. 1991, pp. 711–714.

Kolzer et al, "Quantitative Emission Microscopy", Journal Of Applied Physice, vol. 71, No. 11, Jun. 1, 1992, pp. R23–R41.

Inuzuka, "Hot Electron Analyzer", Nov. 11, 1992, pp. 319–327, Paragraph 4.

Primary Examiner—Vinh P. Nguyen
Attorney, Agent, or Firm—Cushman Darby & Cushman

[57] ABSTRACT

A semiconductor device inspection system having an improved measurement accuracy and in operability. A semiconductor device is observed from the bottom surface side. First, image data obtained upon image pickup under infrared illumination is converted into first left-to-right-reversed image data corresponding to a left-to-right-reversed image and the first reversed image data is stored. Then an image is obtained under no illumination from very weak light emitted from an abnormal portion when a bias is applied to the semiconductor device. Image data of the very weak light image is then converted into second left-to-right-reversed image data corresponding to a left-to-right-reversed image. The first and second left-to-right-reversed image data are superimposedly added to each other and a superimposed image is displayed with the abnormal portion being superimposed on a chip pattern as seen from the top surface of the semiconductor device.

2 Claims, 5 Drawing Sheets

SEMICONDUCTOR DEVICE INSPECTION SYSTEM INVOLVING SUPERIMPOSITION OF IMAGE DATA FOR DETECTING FLAWS IN THE SEMICONDUCTOR DEVICE

BACKGROUND OF THE INVENTION

1. Field of the Invention

The present invention relates to a semiconductor device inspection system used, for example, in anomaly occurrence analysis or reliability evaluation of semiconductor devices. More particularly, the invention relates to a semiconductor device inspection system for detecting from the bottom surface side very weak light in the infrared region as emitted from an anomalous portion in a semiconductor device.

2. Related Background Art

With an increase in integration of semiconductor devices, internal circuits tend to become finer and more complicated, which results in making difficult the detailed anomaly occurrence analysis or reliability evaluation of internal circuits.

In such an existing state, much attention is focused on the analysis technology to track down the location of an anomalous portion by detecting very weak light emitted from the anomalous portion in semiconductor device. An emission microscope is known as a semiconductor device inspection apparatus utilizing such analysis technology.

The emission microscope picks up with high sensitivity very weak light as caused by hot carriers, which are produced when an electric field is concentrated on an anomalous portion in a semiconductor device, or very weak light in the infrared region as caused by recombination, for example in latchup. Therefore, the emission microscope has an excellent function to inspect a semiconductor device to be checked with no contact and with high accuracy while being superior in operability.

The emission microscope, however, has the following problem. Since it detects emission in the visible to infrared region, it could become incapable of measuring emission if there exists some shielding object between an anomalous portion emitting very weak light and the emission microscope.

Specifically, highly integrated devices such as VLSI semiconductor devices tend to employ the chip structure in which interconnection between numerous elements such as transistors is made by multilayer wiring located on the top surface side. The multilayer wiring is likely to interrupt the very weak light caused by an anomaly of an element underneath the multilayer wiring, thus causing a problem of inability to measure or not permitting high-accuracy measurement. Also, a semiconductor device to which the packaging structure is applied has such an arrangement that a lead frame covers the top of the semiconductor chip. Thus, similar to the case of the multilayer wiring, the lead frame will act as a shielding object to interrupt the very weak light, resulting in inability of measurement or not permitting high-accuracy measurement.

Further, there is another problem in applications of the emission microscope. In the case of observation of an anomalous portion in a plastic-molded semiconductor device, the top plastic mold layer is chemically removed for example by fuming nitric acid to expose the surface of the semiconductor chip. Further, a predetermined bias power source is connected to a lead frame to supply power to internal circuits formed in the semiconductor chip. With the power supply, very weak light is emitted from an anomalous portion, which is observed from the top side of the semiconductor chip. When the plastic mold is chemically removed for example by fuming nitric acid, the internal circuits or other elements formed in the semiconductor chip could be damaged, which could interfere with observation of an anomalous portion.

SUMMARY OF THE INVENTION

The present invention has been accomplished taking the above problems into consideration. It is an object of the present invention to provide a semiconductor device inspection system which is easy in operation and which performs failure analysis of semiconductor devices having the structure which has not been within the realms of possibility of emission analysis.

In the present invention, a measured semiconductor device is subjected to image pickup from the bottom side thereof to obtain a pattern image and an image of very weak light from an anomaly-occurring portion and to indicate a superimposed image of the images as if it is seen from the top side. Thus, even if there exists a light shielding object such as Al wiring on the top surface side, the invention permits the anomaly-occurring portion to be exactly located. Further, the image of very weak light is converted in real time into an image as seen from the top side, to be displayed, and coordinates of the position of the anomaly-occurring portion are calculated. Then the anomaly occurrence analysis can be made within a short time on a CAD layout pattern or on a coordinate system compatible with another inspection system on CAD navigation system. Therefore, the invention permits high-speed anomaly occurrence analysis of semiconductor devices and can provide a semiconductor device inspection system superior in operability and in measurement accuracy.

DETAILED DESCRIPTION OF THE PREFERRED EMBODIMENT

Figure 1:
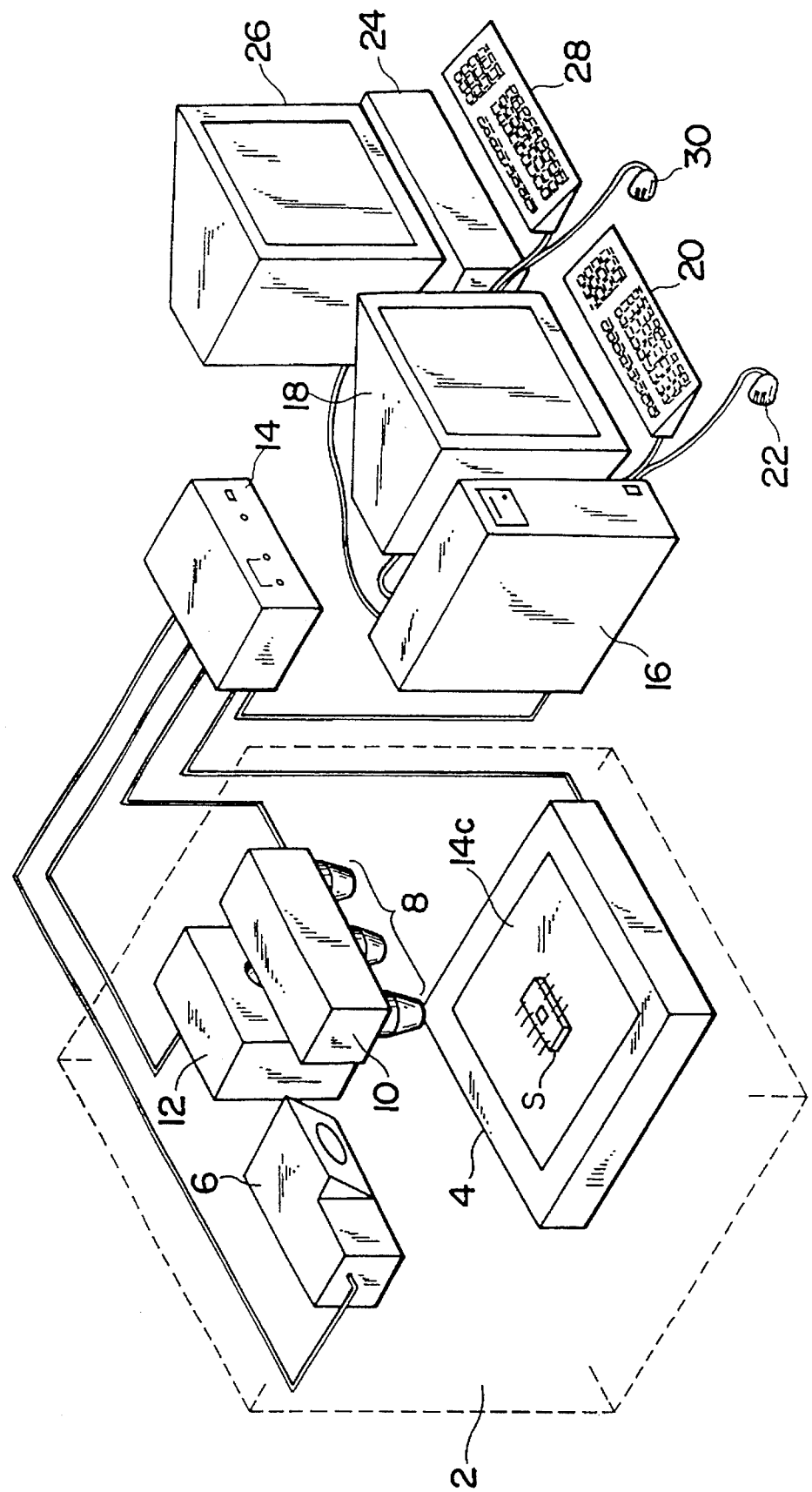
FIG. 1 is a structure explanation drawing to show the entire structure of an embodiment of a semiconductor inspection system according to the present invention.

An embodiment of semiconductor device inspection system according to the present invention will be described with reference to the accompanying drawings. First, the entire structure of the embodiment will be described with reference to FIG. 1. The semiconductor device inspection system is mainly composed of an observation section, a control section and an analysis section.

The observation section is provided with a dark box 2 for intercepting incidence of external light. Enclosed in the box 2 are a motor-driven XYZ stage 4 for carrying a semiconductor device S to be measured thereon and moving it in the X,Y,Z coordinate directions, an infrared-ray epi-illumination device 6 for irradiating infrared light onto the semiconductor device S, a lens changeover device 10 equipped with objective lenses 8 opposed to the semiconductor device S and having mutually different magnifications, and a cooled CCD camera head 12 located behind the objective lenses 8 and picking up an image of the semiconductor device S to output an image signal.

The control section has a control unit 14 for controlling operations of the motor-driven XYZ stage 4, the infrared-ray epi-illumination device 6, the lens changeover device 10 and the cooled CCD camera head 12 and for transmitting the image signal from the cooled CCD camera head 12 to the analysis section.

The analysis section has a computer system unit 16 for performing predetermined signal processing on the image signal input through the control unit 14 and controlling the operation of the control unit 14, and a color monitor 18, a ,keyboard input device 20 and a mouse 22 accompanying the computer system unit 16. In addition, the analysis section is provided with an engineering workstation unit 24 for determining the position of an anomaly-occurring portion by analyzing the image signal transmitted through the control unit 14 and the computer system unit 16, and further with a color monitor 26, a keyboard input device 28 and a mouse 30 accompanying the engineering workstation unit 24.

Figure 2:
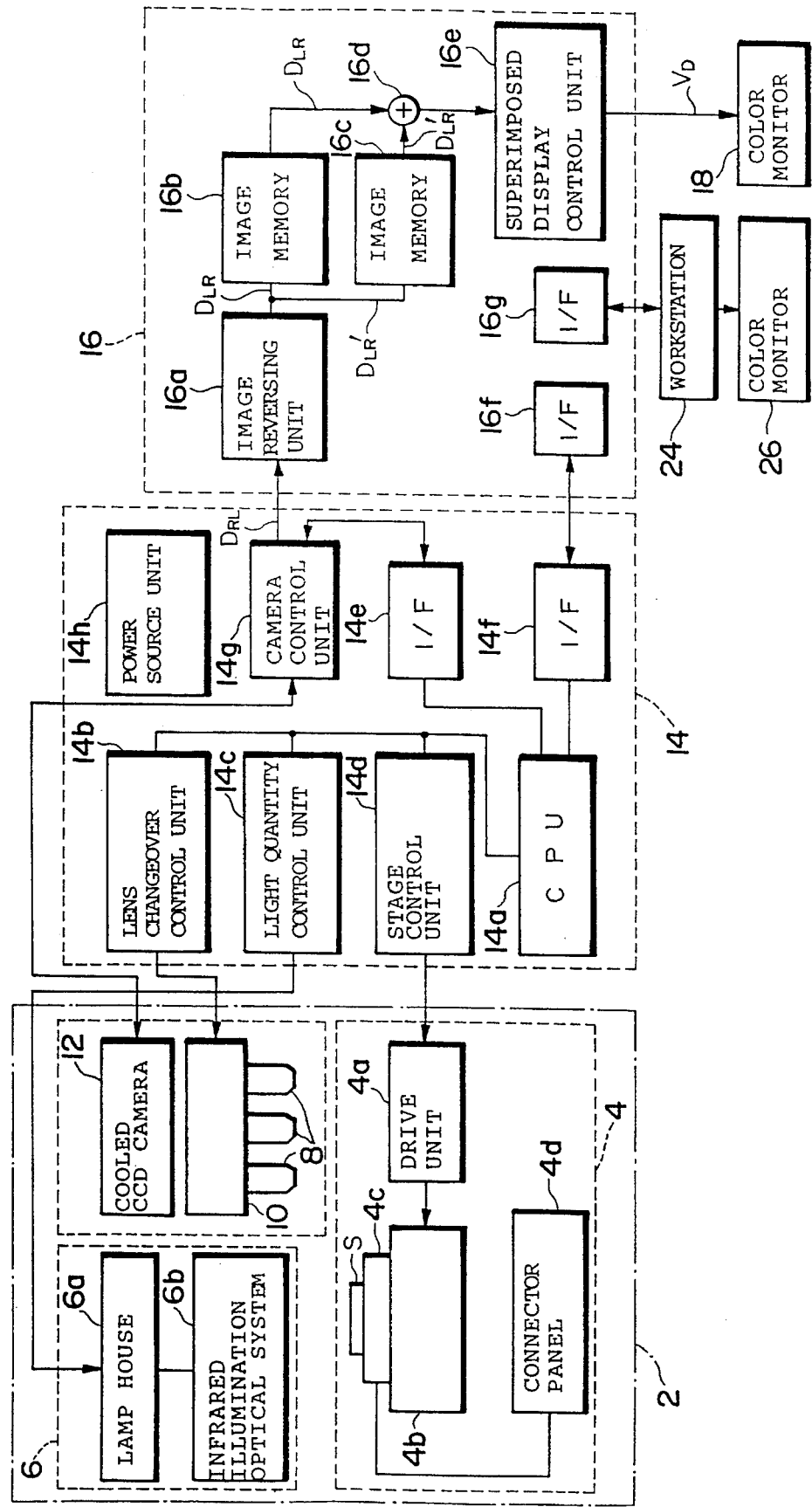
FIG. 2 is a block diagram to show the detailed structure of sections in the embodiment.

The system structure is further detailed referring to FIG. 2.

The motor-driven XYZ stage 4 provided in the observation section has a stage moving mechanism 4b for moving a stage surface in the X, Y, Z coordinate directions by power supplied from a drive unit 4a, a test fixture 4c mounted on the stage surface to help bias application to the semiconductor device S, and a connector panel 4d. A moving amount in the X, Y, Z coordinate directions is set according to a command from a stage control unit 14d in the control unit 14.

The infrared-ray epi-illumination device 6 has a lamp house 6a with a built-in light source, and an infrared illumination optical system 6b for letting only infrared light among the light emitted from the light source pass to illuminate the semiconductor device S. The emission intensity of the light source is arranged to be adjusted by a light quantity control unit 14c in the control unit 14.

The lens changeover device 10 makes one of the objective lenses 8 face the semiconductor device S in accordance with a command from a lens changeover control unit 14b in the control unit 14, achieving changeover of measurement magnification.

The cooled CCD camera head 12 has a CCD solid state image sensor set in vacuum atmosphere with a matrix of 1000×1018 pixels as cooled by a Peltier element. The CCD solid state image sensor picks up an image of the semiconductor device S through the objective lens 8 in the lens changeover device 10. The image sensor is so arranged that changeover is possible between a fast pickup mode with pickup frequency (one frame frequency) of 8 Hz and a slow pickup mode with pickup frequency of 0.25 Hz. Either one of the two modes is selected according to a command from a camera control unit 14g in the control unit 14. During image pickup in a selected pickup mode, the camera control unit 14g A/D-converts an image signal output at timing of point sequential scan reading from the cooled CCD camera head 12 into image data $D_{RL}$ and then outputs it to the analysis section.

The control unit 14 has a central processing unit 14a composed of a microcomputer (CPU) and a power source unit 14h in addition to the lens changeover control unit 14b, the light quantity control unit 14c, the stage control unit 14d, and the camera control unit 14g as described above. The control unit 14 is further equipped with an interface circuit 14f for connecting between the central processing unit 14a and an interface circuit 16f in the computer system unit 16, and an interface circuit 14e for connecting between the central processing unit 14a and the camera control unit 14g. When a measuring person manipulates the keyboard input device 20 and the mouse 22 connected to the interface circuit 16f in the computer system unit 16 to give instructions of lens changeover, light quantity adjustment, stage position adjustment, and changeover of image pickup mode, the central processing unit 14a gives commands corresponding to the respective instructions to the lens changeover control unit 14b, the light quantity control unit 14c, the stage controlling unit 14d, and the camera controlling unit 14g. The interface circuits 14e, 14f, 16f are in conformity with the RS232C standard.

The computer system unit 16 is provided with an image reversing unit 16a for changing the pixel array order of the image data $D_{RL}$ transmitted from the camera control unit 14g to produce left-to-right-reversed image data $D_{LR}$ (or $D_{LR}'$) for obtaining a left-to-right-reversed, reproduced image, an image memory 16b for temporarily storing the left-to-right-reversed image data $D_{LR}$ of one frame from the image reversing unit 16a, an image memory 16c for temporarily storing left-to-right-reversed image data $D_{LR}'$ from the image reversing unit 16a, an adding circuit 16d for adding the left-to-right-reversed image data $D_{LR}$ and $D_{LR}'$ read out from the image memories 16b and 16c pixel by pixel to output resultant data, and a superimposed display control unit 16e for converting the data from the adding circuit 16d into video signal $V_D$ of video rate for each pixel to supply it to the color monitor 18. For convenience' sake of description, the left-to-right-reversed image data stored in the image memory 16b is referred to as $D_{LR}$ while the left-to-right-reversed image data stored in the image memory 16c as $D_{LR}'$.

Figure 3:
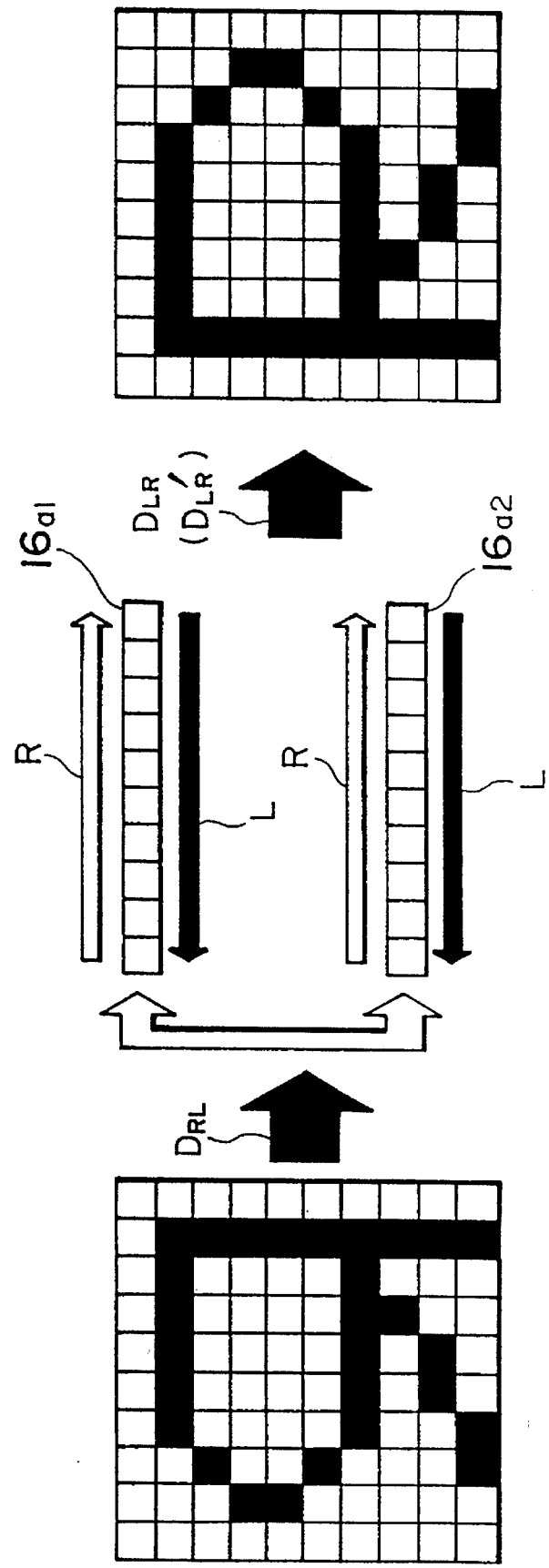
FIG. 3 is a block diagram to show the further detailed structure of an image reversing unit in the embodiment.

The image reversing unit 16a has a pair of line buffers 16a$_1$ and 16a$_2$ for storing and outputting the image data $D_{RL}$ transmitted from the cooled CCD camera head 12 through the camera control unit 14g in a one horizontal line basis, as shown in FIG. 3, and is so arranged that input timing of image data $D_{RL}$ and output timing of left-to-right-reversed image data $D_{LR}$ (Or $D_{LR}'$) are synchronized with one horizontal read cycle of the cooled CCD camera head 12.

Further, these line buffers 16a$_1$, 16a$_2$ each receive the image data $D_{RL}$ in such a manner that the image data $D_{RL}$ is input into either line buffer while being sequentially shifted in the direction shown by the arrow R in FIG. 3 in synchronization with the point sequential reading timing so as to store one horizontal line of image data $D_{RL}$. Conversely, the line buffers each output the data such that the data is output as sequentially shifted in the direction shown by the arrow L in FIG. 3, whereby the once stored image data $D_{RL}$ is output in the reverse order to that upon input. Accordingly, the thus output image data is left-to-right-reversed image data $D_{LR}$, which is reversed left to right with respect to the pixel order in the image data $D_{RL}$. Further, in synchronization with the above one horizontal reading cycle, one line buffer 16a$_1$ is in input operation while the other line buffer 16a$_2$ is in output operation. The operations of line buffers are switched by turns in synchronization with the above one horizontal reading cycle.

Accordingly, while the line buffer 16a$_1$ is in input operation to store one horizontal line of image data $D_{RL}$, the other line buffer 16a$_2$ outputs the image data $D_{RL}$ having been stored in the previous one horizontal reading cycle in the direction shown by the arrow L so as to output the left-to-right-reversed image data $D_{LR}$ (or $D_{LR}'$) to the image memory 16b (or 16c). Conversely, while the line buffer 16a$_2$ is in input operation to store one horizontal line of image data $D_{RL}$, the other line buffer 16a$_1$ outputs the image data $D_{RL}$ having been stored in the previous one horizontal reading cycle in the direction shown by the arrow L so as to output the left-to-right-reversed image data $D_{LR}$ (or $D_{LR}'$) to the image memory 16b (or 16c). Repeating such left-to-right-reversing process as switching the operations every one horizontal reading cycle, the non-converted image data $D_{RL}$ is thus converted into the left-to-right-reversed image data $D_{RL}$ (or $D_{LR}'$), as shown in FIG. 3, for example. Such left-to-right-reversing process is carried out in real time in synchronization with the one horizontal reading cycle of the cooled CCD camera head 12 and the timing of point sequential scan reading in the pixel-by-pixel basis.

Further, the computer system unit 16 includes an interface circuit 16g in conformity with the RS232C standard, for example for transmitting the left-to-right-reversed image data $D_{LR}$, $D_{LR}'$ stored in the image memories 16b, 16c and the output data from the adding circuit 16d to the engineering workstation 24. The engineering workstation 24 performs processing including the analysis of anomaly-occurring portion in the semiconductor device S and displays the result on the color monitor 26. As an example, the engineering workstation 24 preliminarily stores layout pattern data of semiconductor device S and shows on the color monitor 26 such an indication that coordinates of an anomalous portion as obtained in observation of semiconductor device S are superimposed on the layout pattern data, displaying a specific location of the anomalous portion on the layout pattern. In addition to this, the workstation can perform image processing such as enlargement and reduction, pseudo color processing, gray scale transformation and emission amount profile, and data analysis.

Figure 4:
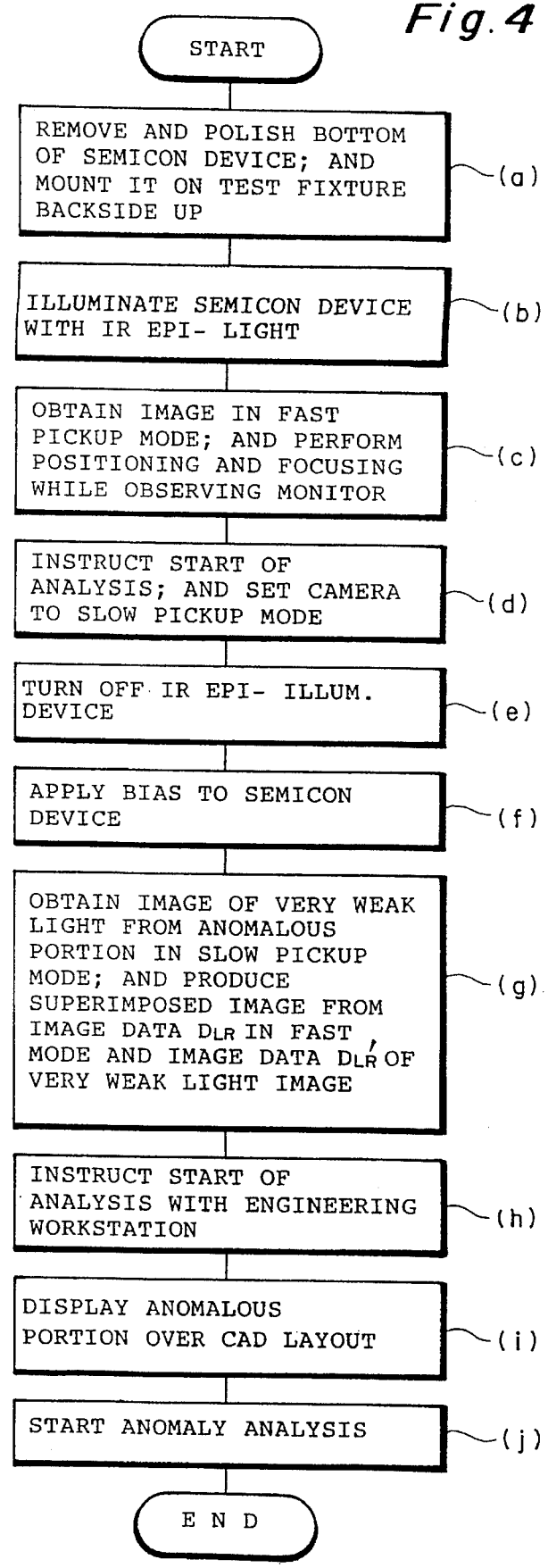
FIG. 4 is a flowchart to illustrate the operation of the embodiment.

The operation of the semiconductor device inspection system as so arranged is next described referring to the flowchart shown in FIG. 4.

First, at Step (a) a measuring person removes the bottom portion 40 of mold package of semiconductor device S and polishes to obtain a mirror-finished surface 42 of substrate of semiconductor chip and sets the semiconductor device S on the test fixture 4c such that the bottom surface is opposed to the infrared-ray epi-illumination device 6 and the objective lenses 8.

Next, at Step (b) the measuring person manipulates the mouse 22 to illuminate the semiconductor device S by the infrared-ray epi-illumination device 6.

Figure 5:
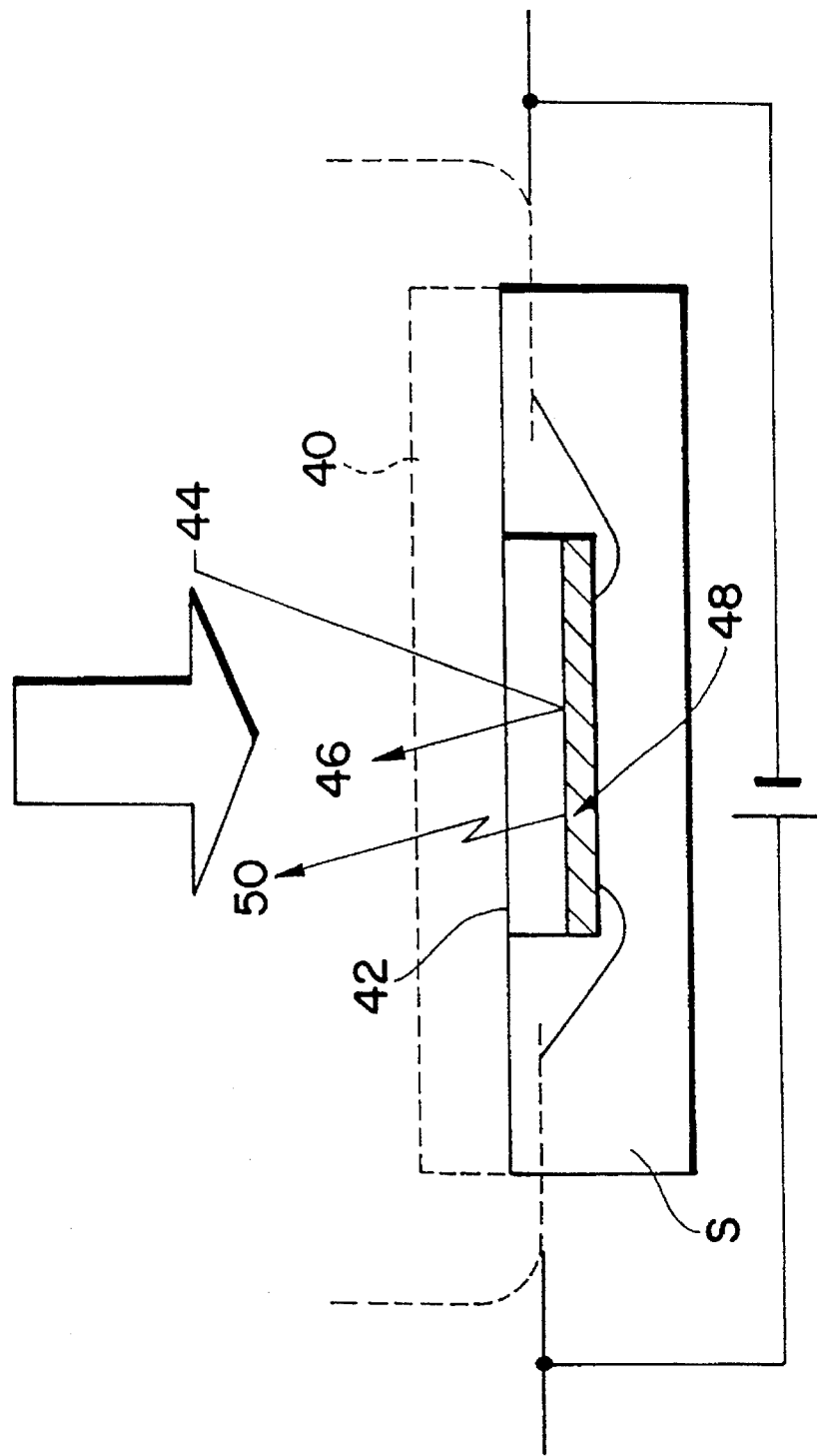
FIG. 5 is an explanatory drawing to illustrate the principle of observation in the embodiment.

Then at Step (c) the measuring person sets the cooled CCD camera 12 to the fast pickup mode to start the image pickup operation. Thus, as shown in FIG. 5, infrared epi-light 44 impinging on the bottom surface of semiconductor device S passes through the semiconductor substrate of the semiconductor chip and light reflected on the surface of the semiconductor chip 46 is received by the cooled CCD camera head 12 through an objective lens 8, whereby a pattern image of the surface of the semiconductor chip is obtained from the bottom surface side.

In detail, an image signal output from the cooled CCD camera head 12 is equivalent to a signal representing a left-to-right-reversed image of the surface pattern of semiconductor chip. This image signal is converted into digital image data $D_{RL}$ by the camera control unit 14g. Further, as described with FIG. 3, the image reversing unit 16a converts the digital image data into the left-to-right-reversed image data $D_{LR}$ in which an array of pixels are reversed left to right in the pixel unit. The thus converted data is temporarily stored in the image memory 16b. Then the left-to-right-reversed image data $D_{LR}$ is read in real time out of the image memory 16b. The thus read data is displayed as an image on the color monitor 18 through the adding circuit 16d and the superimposed display control unit 16e. Since the image data $D_{RL}$ input into the image reversing unit 16a is data of pattern image as seen from the bottom side of semiconductor chip in the semiconductor device S, the left-to-right-reversed image data $D_{LR}$ is data of pattern image as seen from the top surface side of semiconductor chip in the semiconductor device S (i.e., a normal image of top surface pattern). Therefore, the image displayed on the color monitor 18 is a normal image of top surface pattern. Then the measuring person moves the motor-driven XYZ stage 4 while observing the image displayed on the color monitor 18 thereby to determine a portion to be observed on the semiconductor device S, and adjusts the height thereby to make the image focused.

Next, at Step (d) shown in FIG. 4, after specifying a portion to be observed, the measuring person gives an instruction to start emission analysis. The system holds the left-to-right-reversed image data $D_{LR}$ of one frame stored in the image memory 16b immediately before the instruction and stops input of new data. At the same time, the epi-illumination device 6 is turned off (Step (e)) and then the test fixture 4c starts applying an operating voltage to the semiconductor device S and applying a predetermined signal such as an operation timing clock thereto (Step (f)).

Then at Step (g) the cooled CCD camera head 12 is turned into the slow pickup mode to start picking up an image. If there exists some anomaly-occurring portion on the semiconductor chip in the semiconductor device S, the portion will emit very weak light, which will be picked up as an image thereof by the cooled CCD camera head 12. Since exposure is made for a long period of time in the slow pickup mode, a clear image of very weak light is obtained. Then the image signal of the image of very weak light output from the cooled CCD camera head 12 is converted into digital image data $D_{RL}$ in the camera control unit 14g and the thus converted data is transferred to the image reversing unit 16a. Further, the image is converted into left-to-right-reversed image data $D_{LR}'$ in which an array of pixels are reversed left to right and the reversed image data is stored in the image memory 16c.

Since the image of very weak light emitted from the anomaly-occurring portion is taken from the bottom surface side of semiconductor device S, the left-to-right-reversed image data $D_{LR}'$ output from the image reversing unit 16a is data of an image which can be obtained when the semiconductor chip in the semiconductor device S is observed from the top side. Then the adding circuit 16d adds up the image data $D_{LR}$ of the top surface pattern image of semiconductor chip read out of the image memory 16b and the image data $D_{LR}'$ of very weak light image read out of the image memory 16c. Further, the superimposed display control unit 16e converts the added data into a video signal of video rate, so that a superimposed image of the top surface pattern image of semiconductor chip and the very weak light image is displayed on the color monitor 18, enabling the measuring person to specify the location of the anomaly-occurring portion. Also, the image pickup by the cooled CCD camera head 12 and the display by the color monitor 18 are made in real time.

Next at Step (h), the measuring person gives an instruction that he or she recognized the anomaly-occurring portion on the color monitor 18, through the mouse 30 or through the keyboard input device 28. Then the engineering workstation 24 gives a command through the interface 16g to the computer system unit 16 to transmit the left-to-right-reversed image data $D_{LR}$, $D_{LR}'$ in the image memories 16b, 16c and the coordinate data of the anomaly-occurring portion to the CAD navigation system in the engineering workstation 24.

Then at Step (i), the CAD navigation system makes the color monitor 26 display a superimposed image of preliminarily input layout pattern data of semiconductor device S and mark data indicating coordinates of the anomaly-occurring portion. The color monitor 26 thus displays the anomaly-occurring portion on the image of layout pattern, which enables the measuring person to surely determine the location of the anomaly-occurring portion. The CAD navigation system is also arranged to perform analysis in comparison with data obtained by another inspection system.

Then at Step (j) the measuring person can analyze the anomaly while observing the display on the color monitors 18, 26.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No. 177957/1993 filed on Jul. 19, 1993 is hereby incorporated by reference.

What is claimed is:

1. A semiconductor device inspection system comprising:

infrared-ray epi-illumination means for illuminating a polished surface of a substrate of a semiconductor chip with infrared light;

image pickup means for picking up at least a pattern image on the semiconductor chip;

image reversing means for producing first left-to-right-reversed image data by left-to-right-reversing an array of pixels in image data output when said image pickup means picks up the pattern image on the semiconductor chip under illumination by said infrared-ray epi-illumination means and for producing second left-to-right-reversed image data by left-to-right-reversing an array of pixels in image data output when said image pickup means picks up an image of very weak light emitted from an anomalous portion in the semiconductor chip through the substrate of the semiconductor chip, said semiconductor chip having an operating voltage applied thereto;

adding means for superimposedly adding said first left-to-right-reversed image data and said second left-to-right-reversed image data produced by said image reversing means with pixel arrays of said first and second left-to-right-reversed image data corresponding to one another and for outputting superimposedly added data; and superimposed display control means for controlling a display means so that a restored image is displayed thereon, said display being based on the superimposedly-added data output from said adding means.

2. A semiconductor device inspection system according to claim 1, further comprising means for calculating coordinates corresponding to a position of the anomalous portion in a layout pattern of the semiconductor chip, based on said first and second left-to-right-reversed image data produced by said image data reversing means.

* * * * *